United States Patent
Yuki (10) Patent No.: US 7,126,285 B2
(45) Date of Patent: Oct. 24, 2006

(54) DISPLAY PANEL WITH PHOSPHORESCENT AND FLUORESCENT PIXELS

(75) Inventor: Osamu Yuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/171,189

(22) Filed: Jul. 1, 2005

(65) Prior Publication Data

US 2005/0237285 A1  Oct. 27, 2005

Related U.S. Application Data

(62) Division of application No. 10/438,029, filed on May 15, 2003, now Pat. No. 7,012,377.

(30) Foreign Application Priority Data

May 31, 2002  (JP) ............................. 2002-159000

(51) Int. Cl.
G09G 3/00 (2006.01)
G09G 3/30 (2006.01)
G09G 5/00 (2006.01)

(52) U.S. Cl. .............................. 315/169.2; 315/169.3; 345/204; 345/77

(58) Field of Classification Search ................ 315/167, 315/175, 169.2, 169.3; 313/503, 504; 345/204, 345/690, 214, 47, 48, 76, 77
See application file for complete search history.

(56) References Cited

U.S. PATENT DOCUMENTS 6,414,444 B1 * 7/2002 Fox et al. ................. 315/169.3
6,570,315 B1 * 5/2003 Luo et al. .................... 313/422
2002/0030647 A1 * 3/2002 Hack et al. .................... 345/82
2002/0158574 A1 10/2002 Wolk et al. ................. 313/504
2003/0042848 A1 3/2003 Park et al. ................... 313/503
2004/0100432 A1 5/2004 Hajto et al. ................... 345/87

OTHER PUBLICATIONS

C.W. Tang et al., "Electroluminescence of Doped Organic Thin Films", J. Appl. Phys. vol. 65, No. 9, pp. 3610-3616 (1989).
C.W. Tang et al., "Organic Electroluminescent Diodes", Appl. Phys., Lett., vol. 51, No. 12, pp. 913-915 (1987).
M.A. Baldo et al., "Very High-Efficiency Green Organic Light-Emitting Devices Based on Electrophosphorescence", Appl. Phys., Lett., vol. 75, No. 1, pp. 4-6 (1999).

* cited by examiner

Primary Examiner—Thuy Vinh Tran
(74) Attorney, Agent, or Firm—Fitzpatrick, Cella, Harper & Scinto (57) ABSTRACT

A display panel comprises a plurality of arranged pixels of organic EL devices, each having a pair of electrodes and a luminescent layer containing an organic EL material and sandwiched between the electrodes. The plurality of arranged pixels include fluorescent pixels of organic EL devices formed by mainly using a fluorescent material and phosphorescent pixels of organic EL devices formed by mainly using a phosphorescent material. A display apparatus comprises a controller for controlling the display panel, including correcting the difference between the electroluminescent characteristics of the fluorescent pixels and those of the phosphorescent pixels.

4 Claims, 11 Drawing Sheets

TIME [μs]

EXCITATION

FIG. 21B

PHOSPHORESCENCE

FIG. 22A

EXCITATION

FIG. 22B

FLUORESCENCE

DISPLAY PANEL WITH PHOSPHORESCENT AND FLUORESCENT PIXELS

REFERENCE TO RELATED APPLICATION

This is a divisional of U.S. patent application Ser. No. 10/438,029, filed on May 15, 2003, which issued as U.S. Pat. No. 7,012,377 on Mar. 14, 2006.

BACKGROUND OF THE INVENTION

1. Field of the Invention

This invention relates to a display panel and a display apparatus. More particularly, this invention relates to a display panel comprising a plurality of pixels formed by using organic electroluminescent devices (organic EL devices) and also to a display system comprising such a display panel.

2. Related Background Art

Organic EL devices are characterized by field luminescence of a thin film multilayer structure capable of emitting light to an enhanced degree of luminance. Organic EL devices can emit light highly efficiently if a low voltage is applied thereto particularly when the number of functional organic layers including at least a luminescent layer of an organic luminescent material is increased ("Applied Physics Letters," Vol. 51, 1987, p. 913; Vol. 65, 1989, p. 3610). Each device has a basic structure of anode/hole transport layer/ luminescent layer (containing an organic luminescent material)/ cathode. In the course of time, an alternative basic structure of anode/hole transport layer/luminescent layer/ electron transport layer/ cathode was proposed to further improve the efficiency. Meanwhile, efforts have been made to improve the emission efficiency by arranging a blocking layer between the luminescent layer and the electron transport layer for the purpose of blocking carriers passing through the luminescent layer or by arranging a metal thin film as electron injection layer between the cathode and the electron transport layer so that carriers may be injected with a low voltage.

In recent years, attention has been paid to luminescent devices including those made of an Ir complex to utilize the luminescence of triplet excitons showing a high occupancy ratio of 75% (single excitons being responsible for the remaining 25%) of electrons and holes injected from electrodes ("Applied Physics Letters," Vol. 75, 1999, p. 5). Fluorescence is used for luminescence caused by transition from an excited state of singlet, whereas phosphorescence is used for luminescence caused by transition from an excited state of triplet.

For example, the chemical compound having the structural formula shown below is an EL material Alq3 developed by C. W. Tang et al. of Kodak Co. and adapted to mainly use fluorescence. Alq3 emits green light and is adapted to produce fluorescence from a singlet state.

Alq3

On the other hand, the compound having the structural formula shown below is an electroluminescent material Ir(ppy)$_3$ that was developed by M. A. Baldo et al. of Princeton University and emits green light just as Alq3. It is adapted to produce phosphorescence from a triplet state and can provide efficiency several times greater than that of Alq3.

Ir(ppy)$_3$

Organic EL devices such as those described above are adapted to field luminescence to an enhanced degree of luminance when an electric current flowing between electrodes or from a thin film transistor (to be referred simply as TFT hereinafter) is used. Therefore, they are expected to find applications in the field of high density display apparatus. Full-color thin film displays can be realized by using organic EL devices that are adapted to emit red, green and blue (RGB) lights.

While the devices of display apparatus that utilize fluorescence as described above show a low efficiency, they response quickly when they decrease light. Some of them (typically made of an electroluminescent material such as Alq3) show a light decreasing delay of about tens of several nano-seconds.

On the other hand, while the devices of display apparatus that utilize phosphorescence as described above show a high efficiency, some of them (typically made of an electroluminescent material such as Ir(ppy)$_3$) show a light decreasing delay between about 0.8 micro-seconds and several milli-seconds.

The luminescence efficiency of a phosphorescent material can remarkably differ from that of a fluorescent material in the initial states because of the respective modes of energy transition of excitons.

In the case of electroluminescence attributable to phosphorescence, carriers are firstly excited to a state above the lowest excited state of singlet and the lowest excited state of triplet. Subsequently, an internal conversion from the lowest excited state of singlet to the lowest excited state of triplet takes place and carriers tend to go back to the ground state, emitting luminescence energy. On the other hand, in the case of electroluminescence attributable to fluorescence, while excitation occurs as in the case of electroluminescence attributable to phosphorescence, carriers that are excited to above the lowest excited state of triplet emit energy as heat. In view of the above described mechanisms of electroluminescence, it may be so concluded that electroluminescence attributable to phosphorescence and electroluminescence attributable to fluorescence differ from each other particularly in terms of service life and the difference of service life is caused by the difference of energy transition among molecules and the resultant difference in terms of emission of heat and morphological changes.

Thus, due to the difference of electroluminescent characteristics between fluorescent materials and phosphorescent materials, efforts have been paid to develop high luminance high quality display panels by arranging pixels made of a single or identical material, which may be a fluorescent material or a phosphorescent material, on the display panel. These days, display apparatus formed by using such display panels are required to perform better than ever.

SUMMARY OF THE INVENTION

In view of the above identified circumstances, therefore the object of the present invention is to provide a high luminance high quality multi-color display panel formed by using organic EL devices and also a display apparatus realized by using such a display panel.

The inventors of the present invention have noticed that a full-color display panel can be made to show a higher luminance and a higher image quality by using both a fluorescent material and a phosphorescent material because electroluminescent materials of different colors show different efficiencies and are required to show different degrees of luminance because of the visual sense of man.

Thus, the present invention provide a display panel comprising a plurality of arranged pixels of organic electroluminescent devices, each having a pair of electrodes and a luminescent layer containing an organic electroluminescent material and sandwiched between the electrodes;

said plurality of arranged pixels including fluorescent pixels of organic electroluminescent devices formed by mainly using a fluorescent material as organic electroluminescent material and phosphorescent pixels of organic electroluminescent devices formed by mainly using a phosphorescent material as organic electroluminescent material.

DESCRIPTION OF THE PREFERRED EMBODIMENTS

Now, the present invention will be described in greater detail by referring to the accompanying drawings that illustrate preferred embodiments of the invention.

Figure 19:
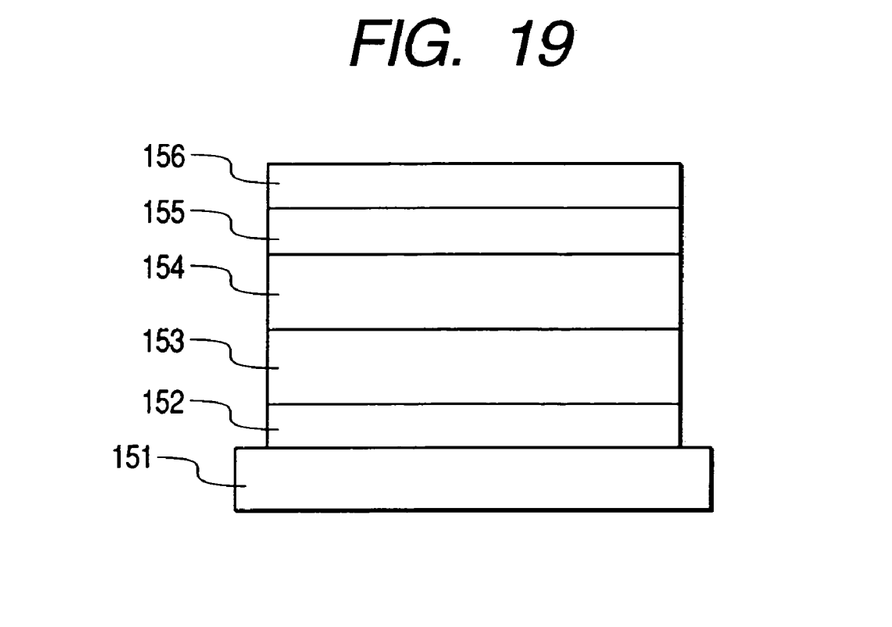
FIG. 19 is a schematic illustration of the configuration of an organic EL device.
Figure 20:
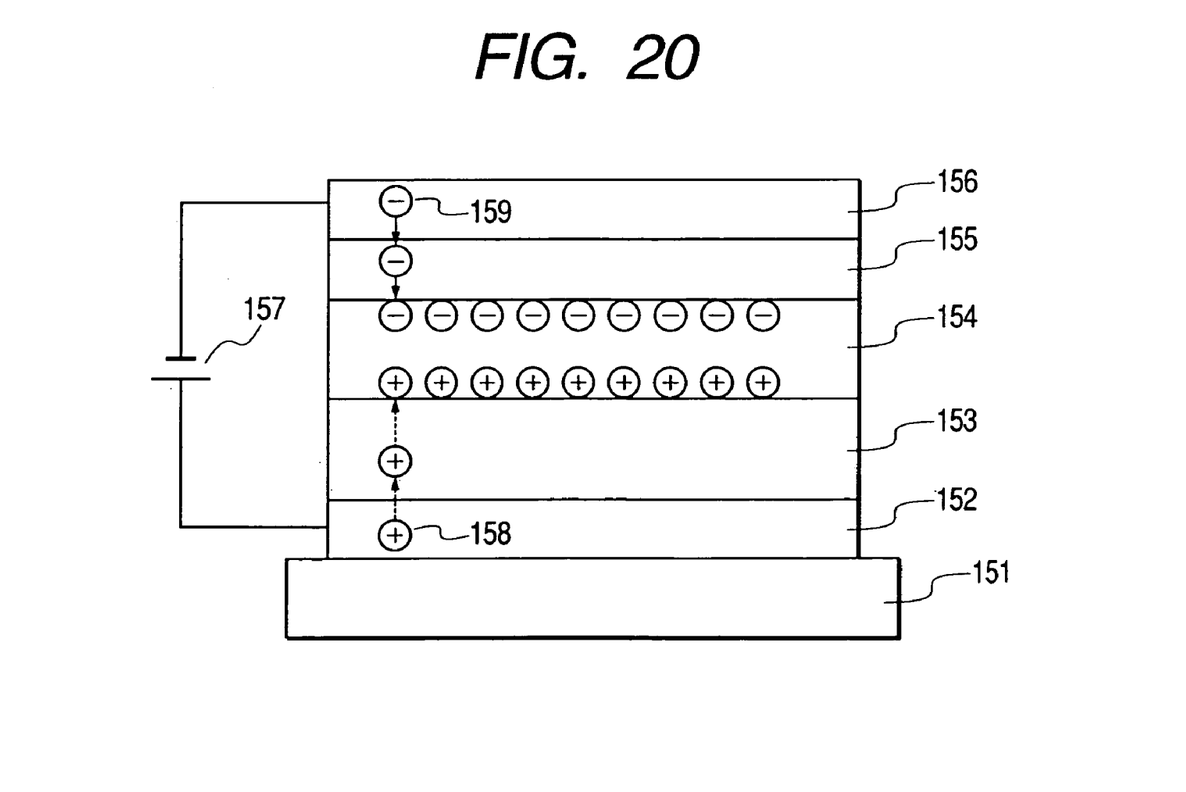
FIG. 20 is a schematic illustration of the principle of electroluminescence of an organic EL device.

FIGS. 19 and 20 are schematic illustrations of a typical organic EL device comprising a pair of electrodes, an anode and a cathode, and an organic layer including at least an luminescent layer containing an organic luminescent material and sandwiched between the electrodes. Referring to FIGS. 19 and 20, there are shown a glass substrate 151, a transparent anode 152 typically made of ITO, a hole transport layer 153, a luminescent layer 154, an electron transport layer 155 and a cathode 156. Referring particularly to FIG.

20, as a positive voltage and a negative voltage are applied respectively to the anode 152 and the cathode 156 from a power source 157, the holes 158 that have passed through the hole transport layer 153 and the electrons 159 that have passed through the electron transport layer 155 make excitons in the luminescent layer 154 and emit light by way of recombination.

Figure 1:
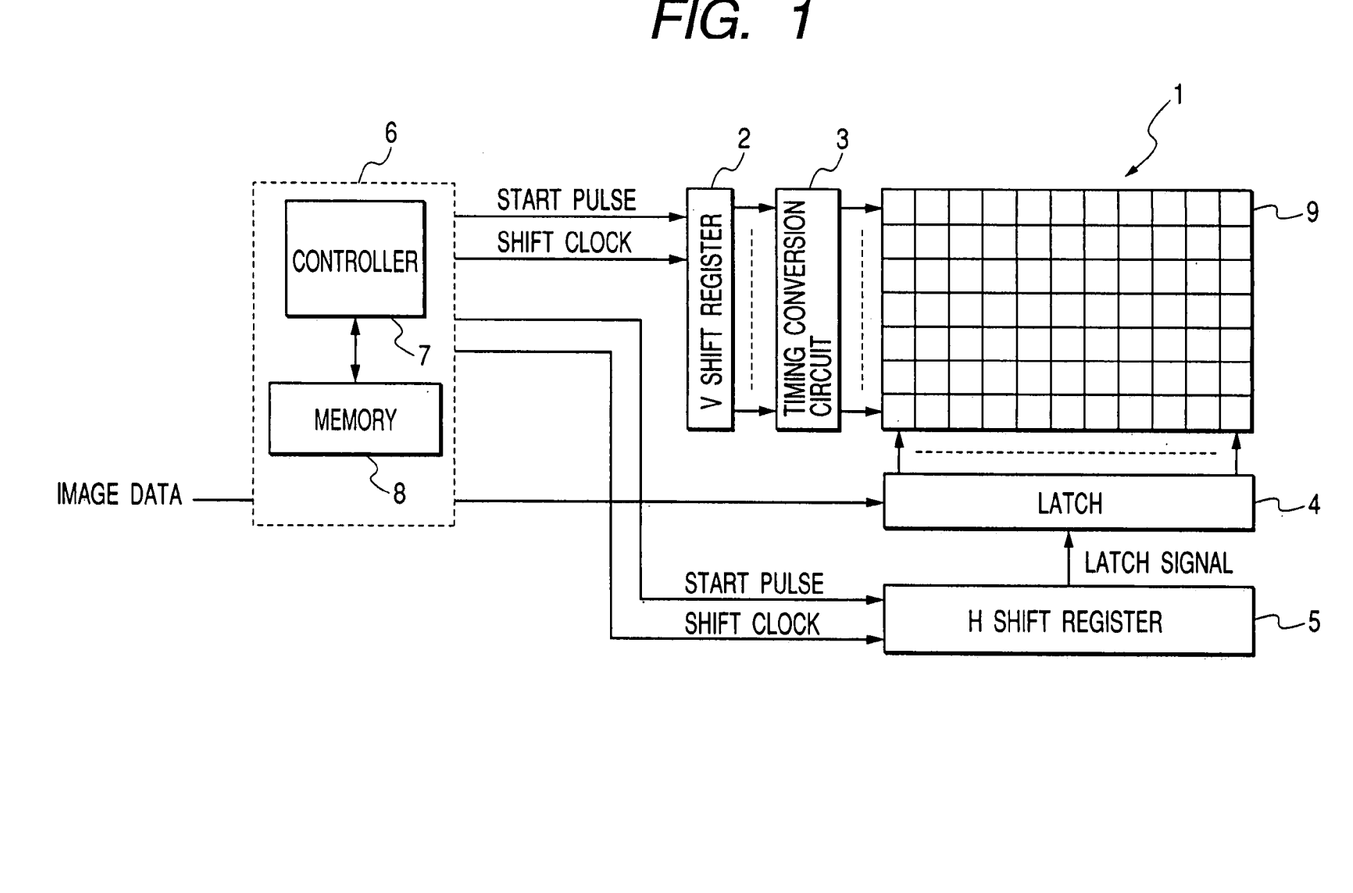
FIG. 1 is a schematic block diagram of an embodiment of display apparatus according to the invention.

FIG. 1 is a schematic block diagram of an embodiment of display apparatus according to the invention. Referring to FIG. 1, the embodiment 1 comprises a display panel 1 formed by arranging a plurality of pixels 9, which include fluorescent pixels and phosphorescent pixels. More specifically, the luminescent layers of the organic EL devices that are used as green pixels are mainly made of a fluorescent material adapted to emit fluorescent light from a singlet state, whereas the luminescent layers of the organic EL devices that are used as red pixels are made of a phosphorescent material adapted to emit phosphorescent light from a triplet state. Note that phosphorescence can show an efficiency that is several times greater than the efficiency of fluorescence, as mentioned above. Also note that the luminescent layers of the organic EL devices that are used as blue pixels are made of a fluorescent material adapted to emit fluorescent light from a singlet state, as in the green pixels. The pixels are arranged to form a matrix on the display panel of the display apparatus as shown in FIG. 1. Thus, as seen from FIG. 3, fluorescent pixels 31, 33 and a phosphorescent pixel 32 coexist in each picture element (group of RGB pixels) of the display panel 1.

It has been noticed that it is difficult to raise the efficiency of red organic EL devices. However, it is now possible to reduce the difference of efficiency among pixels by using fluorescent pixels and phosphorescent pixels to form a display panel particularly when phosphorescent pixels are used only for red. Therefore, for a full-color display using RGB, for example, it is now possible to make all the pixels show an enhanced degree of luminance and at the same time maintain a well balanced state among the organic EL devices of the three primary colors in terms of luminance. Thus, it is possible to provide a high luminance high quality display panel that can display full-color images.

A display panel comprising both fluorescent pixels and phosphorescent pixels can be prepared by patterning a single substrate by means of a known patterning technique so as to form fluorescent pixels and phosphorescent pixels on the same substrate. Alternatively, such a display panel can be prepared by laying a first display section that is formed by arranging only a plurality of fluorescent pixels on a substrate on a second display section that is formed by arranging only a plurality of phosphorescent pixels on another substrate. It should be noted that, when first and second display sections are used, one of the display sections needs to be transparent at the parts thereof that respectively correspond to the pixels of the other display section so that the light from the other display section may be transmitted through the former display section. Additionally, the process of preparing a display panel by using first and second display sections can be simpler than the process of preparing a display panel by forming fluorescent pixels or phosphorescent pixels and subsequently forming phosphorescent pixels or fluorescent pixels, whichever appropriate, on a same single substrate by using a patterning technique.

Preferably, the area of a fluorescent pixel is greater than that of a phosphorescent pixel. As pointed out earlier, phosphorescence can be several times more efficient than fluorescence. In other words, the luminance of phosphorescent pixels per unit area is much greater than that of fluorescent pixels per unit area. Therefore, the difference of luminance can be reduced by differentiating the area of a fluorescent pixel and that of a phosphorescent pixel. More preferably, the ratio of the area of a fluorescent pixel to the area of a phosphorescent pixel is inversely proportional to the ratio of the efficiency of fluorescence of a fluorescent pixel to that of phosphorescence of a phosphorescent pixel. With this arrangement, the difference of luminance can be minimized. The area of the fluorescent pixels and that of the phosphorescent pixels can be differentiated either by a technique of adjusting the area of the organic layers formed at the time of patterning operation so as to differentiate the areas of two different types of electroluminescence or by a technique of differentiating the open areas of two different types of electroluminescence by arranging a shielding section or the like.

Figure 4:
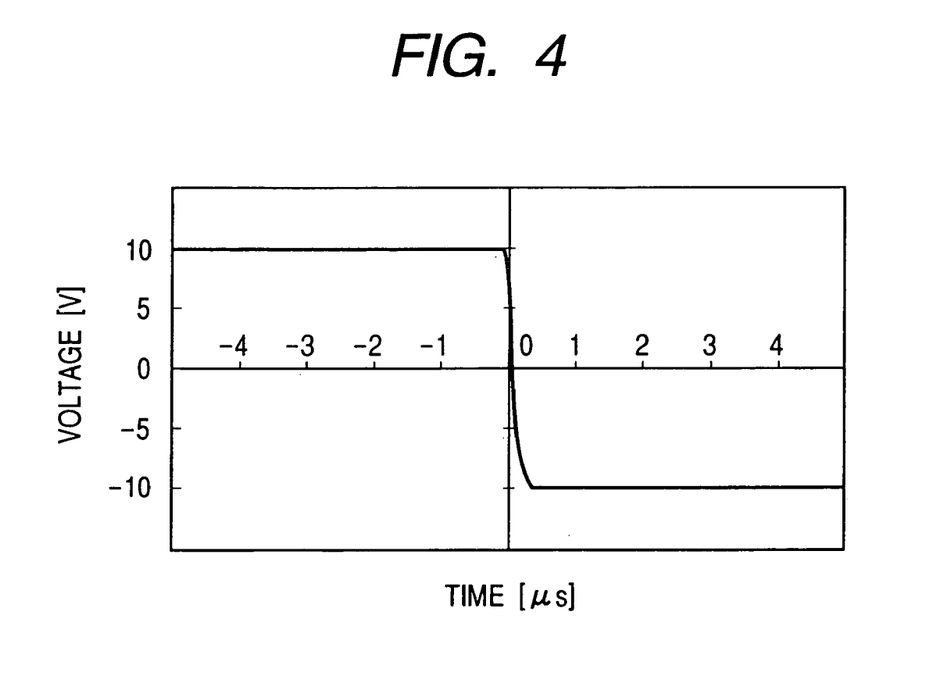
FIG. 4 is a graph illustrating the waveform of a video signal to be input to a display panel of the type under consideration, including a falling edge thereof.
Figure 5:
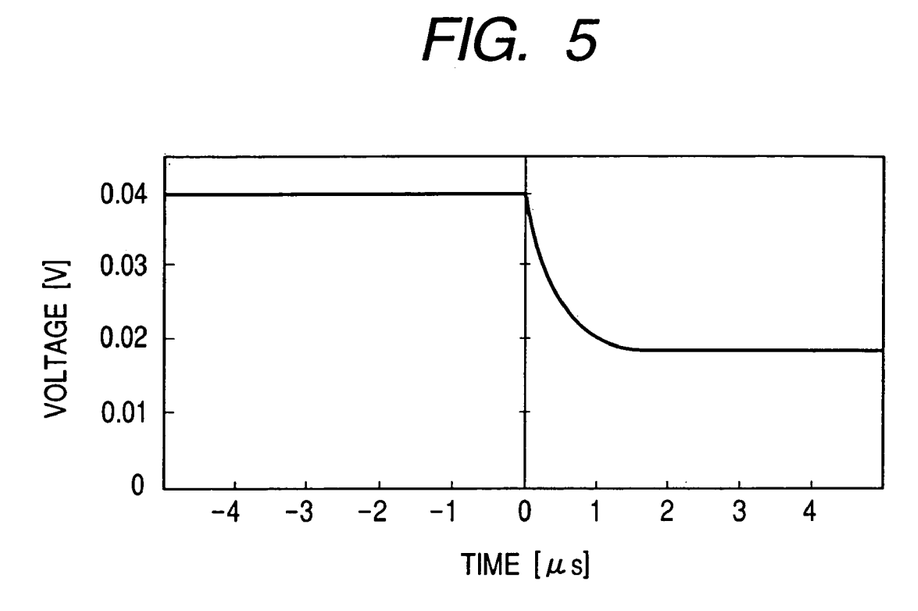
FIG. 5 is a graph illustrating the voltage waveform as observed by an instrument for observing the optical response of a phosphorescent pixel to a video signal showing a waveform as illustrated in FIG. 4.
Figure 6:
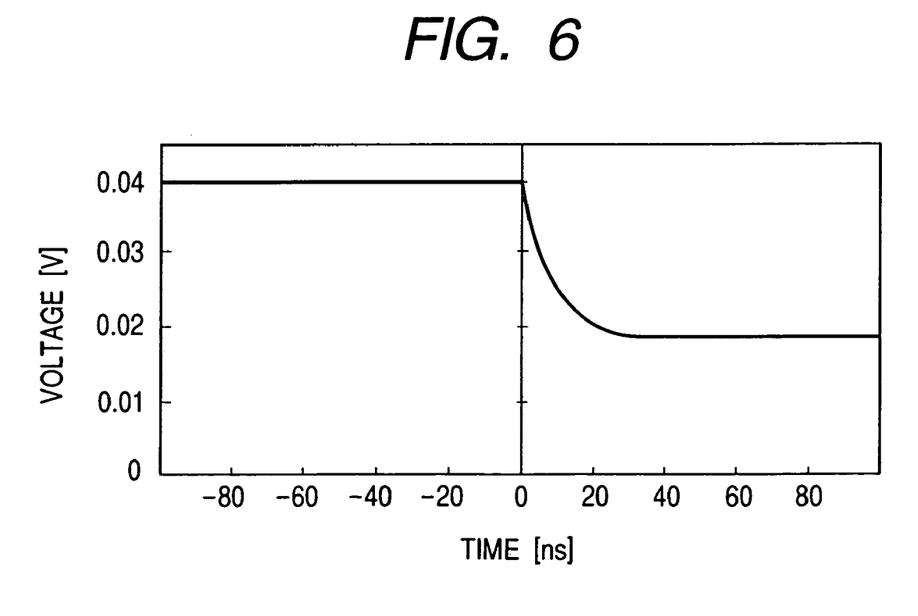
FIG. 6 is a graph illustrating the voltage waveform as observed by an instrument for observing the optical response of a fluorescent pixel to a video signal showing a waveform as illustrated in FIG. 4.

FIG. 4 is a graph illustrating the waveform of a video signal to be input to a display panel of the type under consideration, including a falling edge thereof and FIGS. 5 and 6 are graphs illustrating the voltage waveforms as observed by a photomultiplier for observing the optical response of a phosphorescent pixel and that of a fluorescent pixel to a video signal showing a waveform as illustrated in FIG. 4. Note that the vertical axis of the graph of FIG. 4 represents the voltage of the video signal used for observing the falling edge of the pixel. It will be appreciated from FIGS. 5 and 6 that the optical response of a phosphorescent pixel is about 1 μs while that of a fluorescent pixel is about 30 to 40 ns. In other words, a fluorescent pixel can decrease light more quickly than a phosphorescent pixel if the delay of the original signal is taken into consideration.

When pixels showing different durations of after glow relative to a display signal coexist on a single display panel 1, a specific display color may become noticeable and subsequently disappear.

Figure 21A:
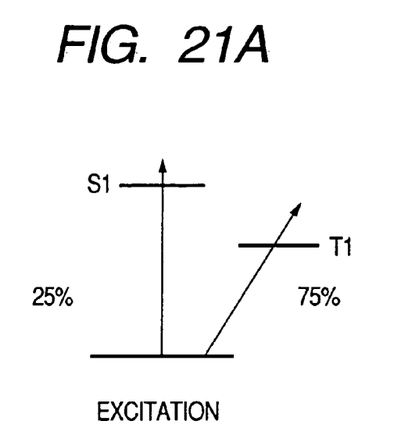
FIGS. 21A and 21B schematically illustrate energy levels that can be used for phosphorescence.
Figure 21B:
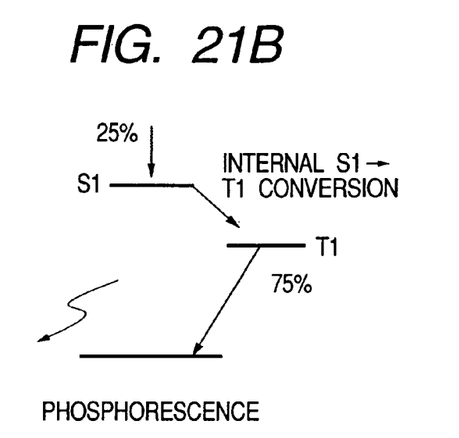
Figure 22A:
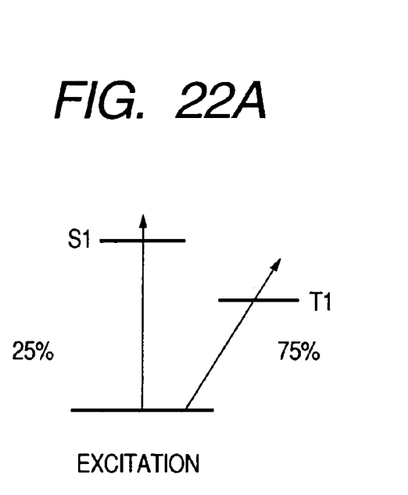
FIGS. 22A and 22B schematically illustrate energy levels that can be used for fluorescence.
Figure 22B:
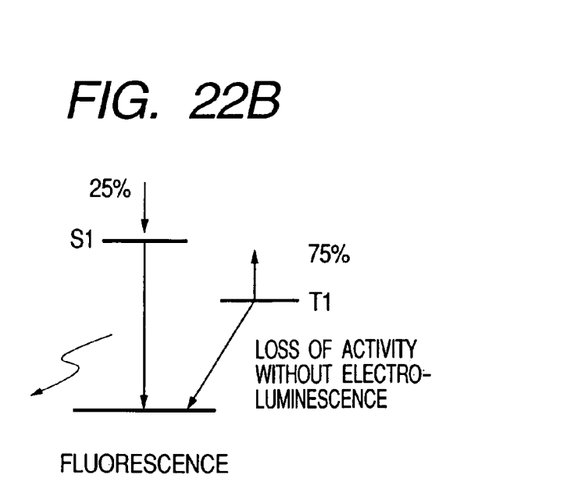

Additionally, as shown in FIGS. 21A and 21B, phosphorescence is produced as carriers are firstly excited to a state above the lowest excited state S1 of singlet and the lowest excited state T1 of triplet and subsequently the state S1 is internally converted to the state T1 and is trying to go back to the ground state, while discharging energy of luminescence. In the case of fluorescence, on the other hand, carriers are excited as in the case of phosphorescence but those that are excited to a state above the state T1 discharge energy as heat as shown in FIGS. 22A and 22B. In view of the mechanisms of electroluminescence, it may be so concluded that electroluminescence attributable to phosphorescence and electroluminescence attributable to fluorescence differ from each other particularly in terms of service life and the difference of service life is caused by the difference of energy transition among molecules and the resultant difference in terms of emission of heat and morphological changes.

Thus, according to the invention, there is provided a display apparatus comprising not only a display panel but also a control means for inputting different signals for the fluorescent pixels and those for the phosphorescent pixels showing different electroluminescent characteristics. With this arrangement, it is possible to supply signals, taking the respective electroluminescent characteristics into consideration.

More specifically, the after glow of a specific color due to the difference of light decreasing timing can be prevented from occurring by delaying the timing of the falling edge of a video signal and/or that of the falling edge of a signal showing a polarity opposite to that of the video signal for the fluorescent pixels relative to the counterparts for the phosphorescent pixels.

More preferably, the control means is provided with a memory means for storing the arrangement and driving conditions of the fluorescent pixels and those of the phosphorescent pixels so that signals that are appropriately corrected by considering the electroluminescent characteristics of the fluorescent pixels and those of the phosphorescent pixels can be input to the pixels. The driving conditions specifically include the voltage to be used for driving the pixels and the time series waveform of the applied voltage.

With the above described arrangement, a higher voltage may be applied to the fluorescent pixels so that any difference of luminance may be eliminated and the difference of efficiency of electroluminescence between the fluorescent pixels and the phosphorescent pixels may be corrected on the basis of the arrangement and driving conditions stored in the memory means regardless of the difference of efficiency of electroluminescence. Additionally, it is possible to store the ratio of the efficiency of electroluminescence of a fluorescent pixel to that of a phosphorescent pixel after a predetermined period of time of operation in a memory means and determine the ratio of the voltages to be applied to the respective pixels after the predetermined period of time in order to correct the difference of service life. With this arrangement, the change in the difference of electroluminescence efficiency ratio after a predetermined period of time that is attributable to the difference of electroluminescence service life can be addressed properly so that the effect of preventing any difference of luminance between the two different types of pixels can be maintained for a long period of time.

(First Embodiment)

The embodiment of display apparatus according to the invention and illustrated in FIG. 1 will be described in greater detail by referring to FIG. 9.

In FIG. 1, reference symbol 1 denotes a display panel on which a plurality of pixels 9 are arranged to form a matrix. In FIG. 1, there are also shown a V shift register 2, a timing converting circuit 3, an H shift register 5 and a latch 4 that are arranged so as to be flush with the display panel 1 and supply video signals and scan signals to the thin film transistors (to be referred to as TFTs hereinafter) of the pixels 9. Thus, the control means of the embodiment comprises all the components of the display apparatus other than the display panel 1, which include the V shift register 2, the timing converting circuit 3, the H shift register 5, the latch 4 and the display control section 6 including a controller 7 and a video signal conversion memory (memory means) 8. The display control section 6 supplies timing signals and video signals.

Figure 9:
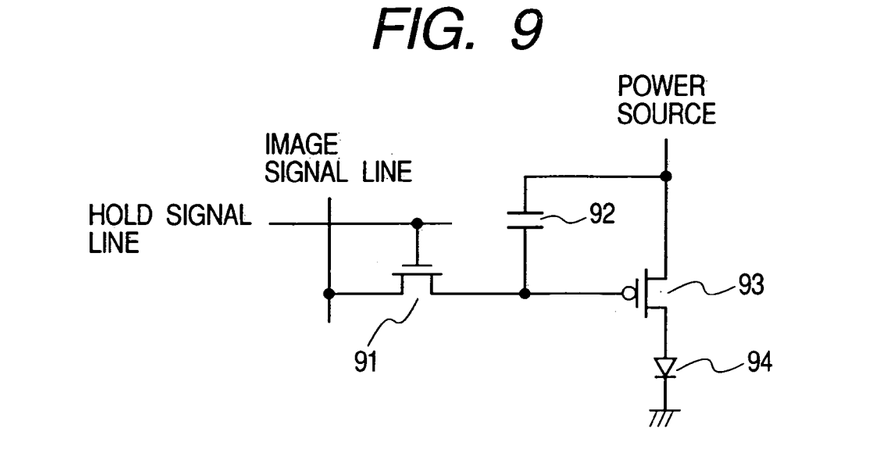
FIG. 9 is a schematic circuit diagram of the current drive TFT circuit in a pixel.
Figure 10:
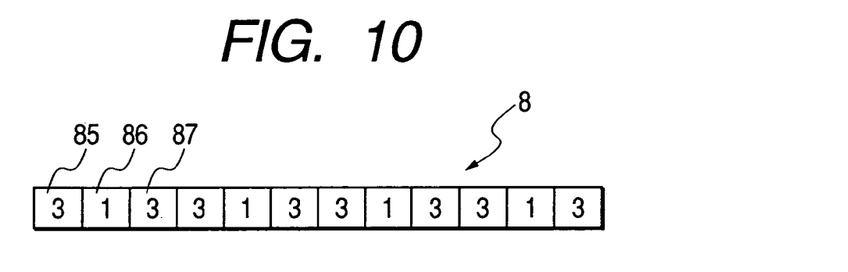
FIG. 10 is a schematic illustration of a video signal conversion memory.

FIG. 9 shows a circuit diagram of a typical circuit that can be used in a pixel 9. In the pixel 9, the source of P-channel type TFT 93 is connected to the power source and the cathode of organic EL device 94 is connected to the ground potential while the anode of the device is connected to the drain of the TFT 93. The gate of the N-channel type TFT 91 is connected to the hold signal line for vertical scanning and the source of the TFT 91 is connected to an image signal line, while the drain line is connected to a hold capacitance 92 and also to the gate of the TFT 93. To make the pixel active for electroluminescence, firstly the hold signal line for vertical scanning is held to a selected state and the video signal latched to the horizontal latch circuit 4 is applied to the image signal line as voltage. Then, the source and the drain of the TFT 91 are held to a conducting state and the hold capacitance 92 is charged or discharged electrically. Then, the gate potential of the TFT 93 comes to agree with the potential of the video signal. If the hold signal for vertical scanning is in an unselected state, the TFT 91 is turned off. At this time, the TFT 93 is separated from the image signal but the potential is held stably due to the hold capacitance 92 connected to the gate of the TFT 93. In this way, an electric current that corresponds to the hold capacitance 92 between the gate and the source of the TFT 93 is supplied to the organic EL device 94.

Figure 3:
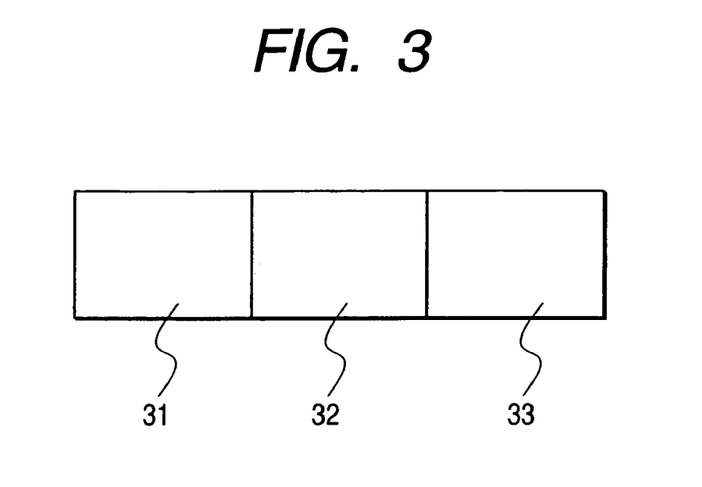
FIG. 3 is a conceptual illustration of phosphorescent pixels and fluorescent pixels arranged for a single scanning line.

The pixels on the display panel 1 of FIG. 1 are arranged to form a matrix and, as shown in FIG. 3, fluorescent pixels and phosphorescent pixels coexist on a same scan line.

Figure 16:
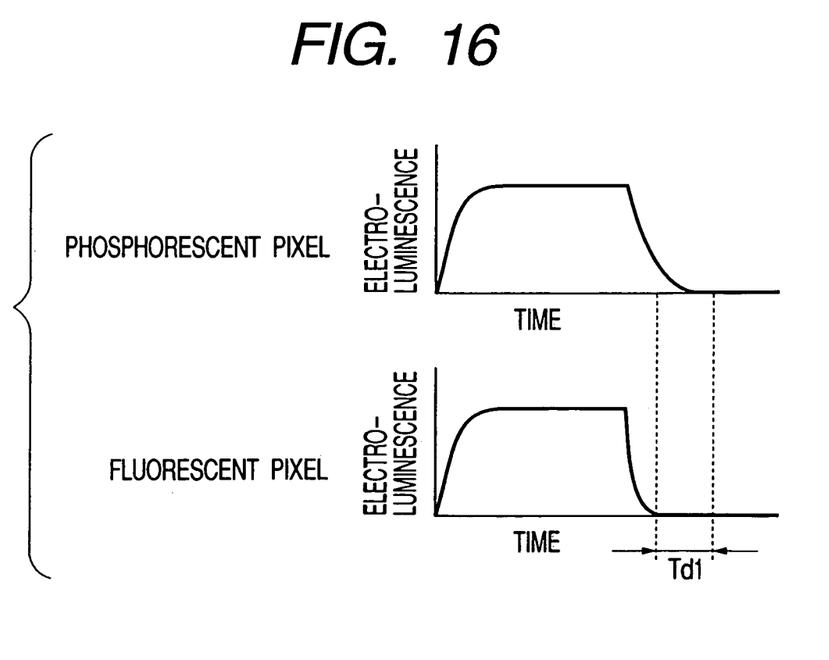
FIG. 16 is a graph illustrating the light decreasing timing of a phosphorescent pixel and that of a fluorescent pixel, which is different from the former light decreasing timing.

With this arrangement, the pixel light decreasing time can differ among the pixels on a same scan line. More specifically, a phosphorescent pixel and a fluorescent pixel arranged on a same scan line show a difference of light decreasing time of Td1 as shown in FIG. 16.

Figure 17:
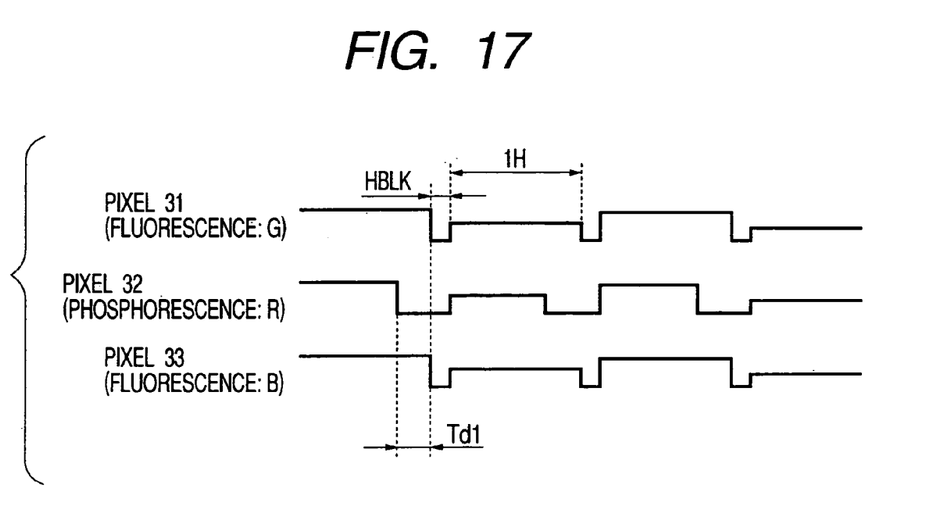
FIG. 17 is a graph illustrating the timing of holding a video signal to be supplied to a phosphorescent pixel and that of holding a video signal to be supplied to a fluorescent pixel, which is different from the former timing.
Figure 18:
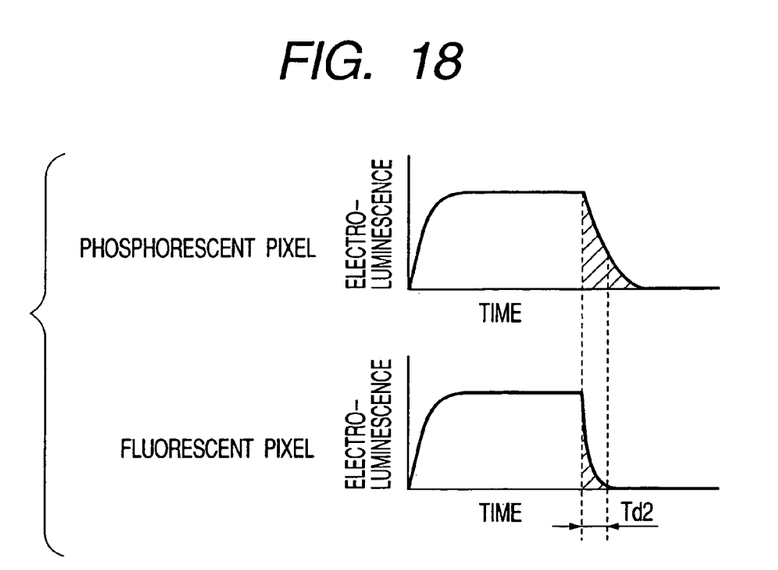
FIG. 18 is a graph illustrating the light decreasing timing of a phosphorescent pixel and that of a fluorescent pixel, which is different from the former light decreasing timing.

This difference is corrected by making the falling edge of the video signal of the phosphorescent pixel 32 come earlier than that of the video signal of the fluorescent pixel by the time period of Td1. In other words, the operation of signal switching to horizontal blank HBLK is made to come earlier for the phosphorescent pixel than for the fluorescent pixel by Td1 as illustrated in FIG. 17.

Figure 7:
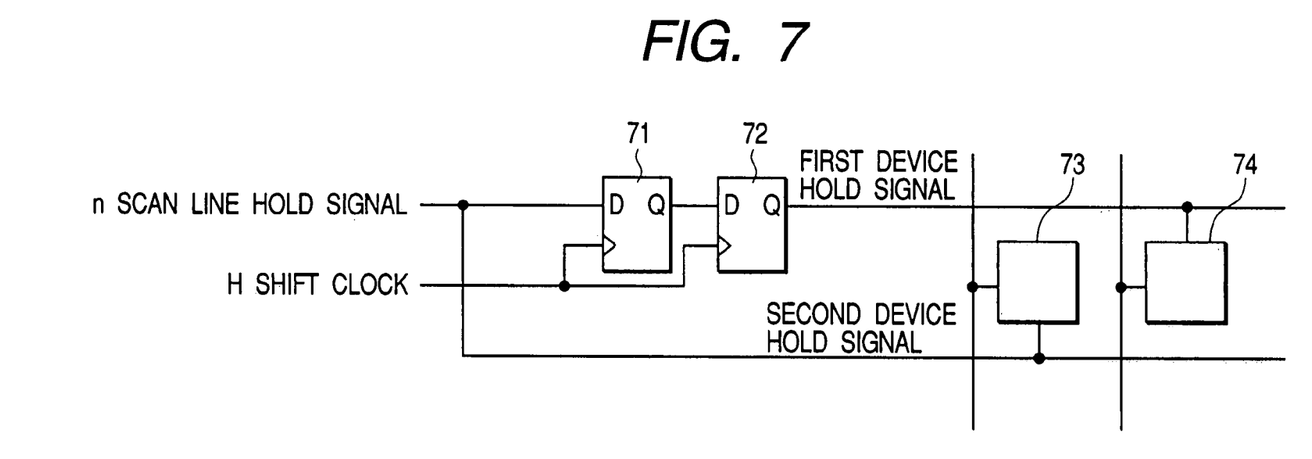
FIG. 7 is a schematic circuit diagram of a means for generating a video signal hold signal for a phosphorescent pixel and a fluorescent pixel.

FIG. 7 is a schematic circuit diagram of a circuit (timing converting circuit 3) that can be used for producing the time difference. Note that n scan line hold signal is supplied from the V shift register 2 in FIG. 1. In FIG. 7, pixel 73 is a phosphorescent pixel and pixel 74 is a fluorescent pixel. Video signal hold signals of two different types including a first device hold signal and a second device hold signal are applied to the pixels arranged on each line. The falling edge of the first device hold signal is delayed by Td1 as shown in FIG. 17 by the shift register formed by flip-flops 71, 72 (the duration of Td1 is determined by the number of steps of the flip-flops and the period of the H shift clock). The rising edge of the first device hold signal and that of the second device hold signal are made to agree with each other as shown in FIG. 17 in synchronism with the generation of a horizontal blank (not shown).

Now, the part of the circuit adapted to correct the difference of the initial efficiencies of electroluminescence of the two different pixels will be described below.

As pointed out above, the initial efficiency of electroluminescence of the fluorescent pixels 31, 33 and that of the phosphorescent pixel 32 remarkably differ from each other because of the difference of internal energy transition.

Figure 11:
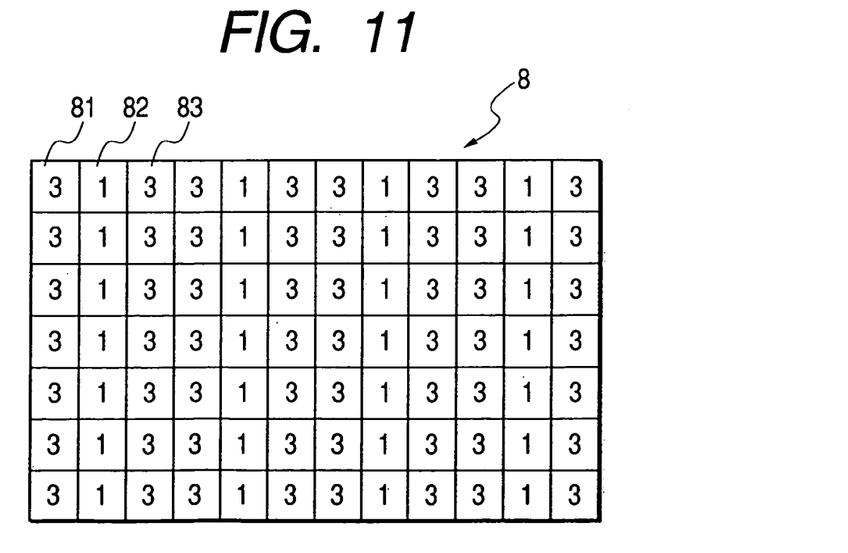
FIG. 11 is a schematic illustration of another video signal conversion memory.

In order to equalize the ratio of electroluminescence to that of visually sensed intensity of the pixels of the two different types, the voltage of video signal is modified by using different magnifications that are determined respectively for the phosphorescent pixel 32 and the fluorescent pixels 31, 33 before it is applied to the horizontal video signal latch 4. FIG. 11 is a schematic illustration of some of the data stored in the video signal conversion memory that is used in this embodiment to deal with this problem. Note that the pixel matrix of the display panel 1 has 12×7 pixels. Theoretically, the efficiency of electroluminescence of a phosphorescent material is three times greater than that of a fluorescent material. Therefore, in FIG. 11, the ratio of the efficiency of electroluminescence of a phosphorescent pixel 32 to that of a fluorescent pixel 31 or 33 is made equal to 1:3, although the present invention is by no means limited thereto.

Figure 12:
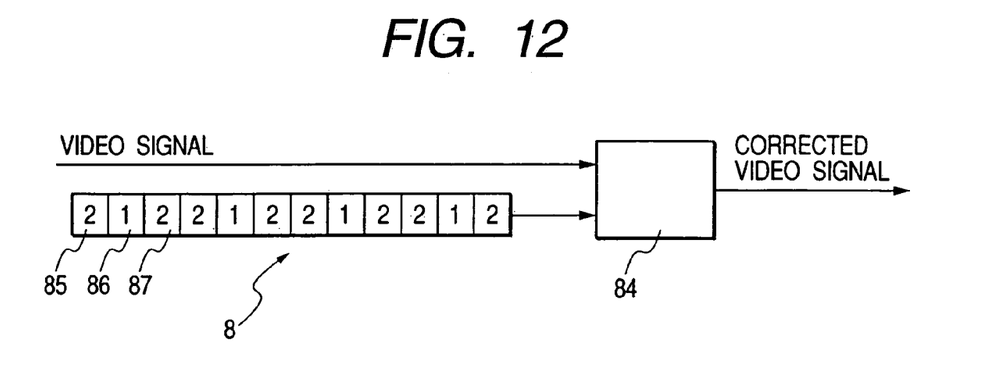
FIG. 12 is a schematic illustration of a video signal correction method utilizing a video signal conversion memory.

The magnifications to be used for the video signal are read with the video signal as shown in FIG. 12 and the video signal is multiplied by the predetermined magnifications before it is fed to the horizontal video signal latch 4. The video signal latched in the horizontal video signal latch 4 is then supplied from the TFT 93 in the pixel to the electroluminescent device 94 as electric current at the timing given by the V shift register 2 in a manner as described earlier. As a result, the initially displayed image of the display apparatus comprising fluorescent pixels and phosphorescent pixels whose efficiencies of electroluminescence are different from each other is made to be uniform in terms of luminance to the visual sense. Note that the luminance of a phosphorescent pixel and that of a fluorescent pixel can be made to be substantially equal to each other to the visual sense by modifying the ratio of their areas.

Figure 13:
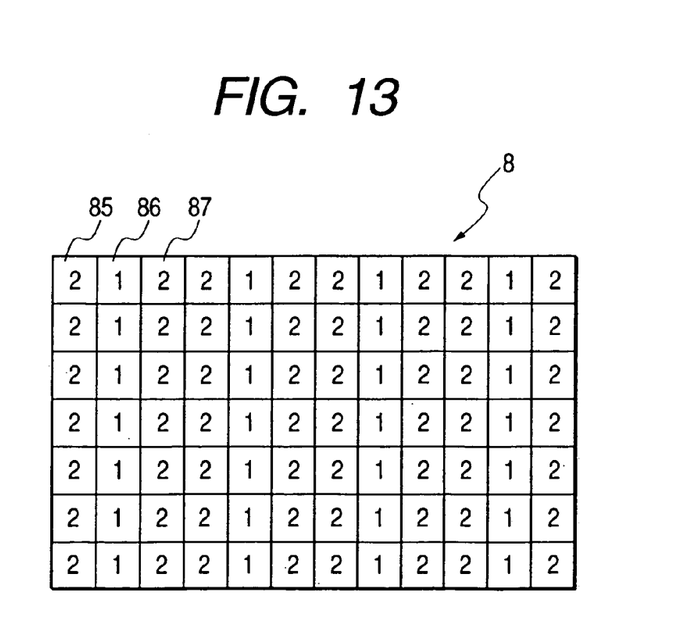
FIG. 13 is a schematic illustration of still another video signal conversion memory.

It is known that the luminance of an organic EL device relative to the electric current falls with time. A phosphorescent pixel 32 and a fluorescent. pixel 31 or 33 are different from each other in terms of the fall of luminance with time. FIG. 13 is a schematic illustration of some of the data stored in the video signal conversion memory of this embodiment that is used to deal with this problem. Note that the pixel matrix of the display panel 1 has 12×7 pixels.

For the initial stages, the ratio of the efficiency of electroluminescence of the phosphorescent pixel 32 to that of the fluorescent pixel 31 or 33 is defined to be equal to 1:3 as shown in FIG. 11. However, after 1,000 hours, the ratio of the efficiency of electroluminescence of the phosphorescent pixel 32 to that of the fluorescent pixel 31 or 33 is defined to be equal to 1:2 as shown in FIG. 13. The video signal conversion memory 8 is rewritten when the controller 7 counts 1,000 hours by using the initially specified factor for changing the ratio. The ratio of magnifications of 1:2 represents the fact that the phosphorescent pixel 32 is degraded more quickly than the fluorescent pixel 31 or 33. The magnifications are read out sequentially with the video signal as shown in FIG. 12 and the video signal is multiplied by a predetermined magnification by a multiplier 84 and supplied to the horizontal video signal latch 4. The video signal latched to the horizontal video signal latch 4 is then supplied from the TFT 93 in the pixel to the organic EL device 94 as electric current at the timing of the V shift register 2 in a manner as described earlier. As a result, the displayed image of the display apparatus comprising fluorescent pixels and phosphorescent pixels whose service lives are different from each other is made to be uniform in terms of luminance to the visual sense regardless of the duration of the use of the display apparatus.

(Second Embodiment)

Figure 15:
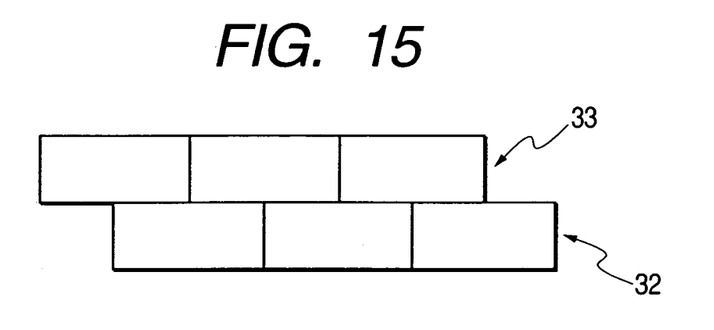
FIG. 15 is a conceptual illustration of phosphorescent pixels and fluorescent pixels arranged for respective scanning lines.

This embodiment has a configuration substantially same as that of First Embodiment shown in FIG. 1. However, in this embodiment, fluorescent pixels 32 and phosphorescent pixels 33 are arranged for respective scanning lines on a display panel 1 as shown in FIG. 15.

With this arrangement, the light decreasing time of pixels differs on a scan line basis and the difference of light decreasing time is equal to Td1 as shown in FIG. 16.

To correct the difference, the delay Td1 of the falling edge for light decreasing phosphorescent pixels is reduced to the area of the pixel and made equal to Td2, which is equal to Td1 in FIG. 17. Thus, the operation of signal switching to horizontal blank HBLK is made to come earlier for the phosphorescent pixel than for the fluorescent pixel by Td1.

Figure 8:
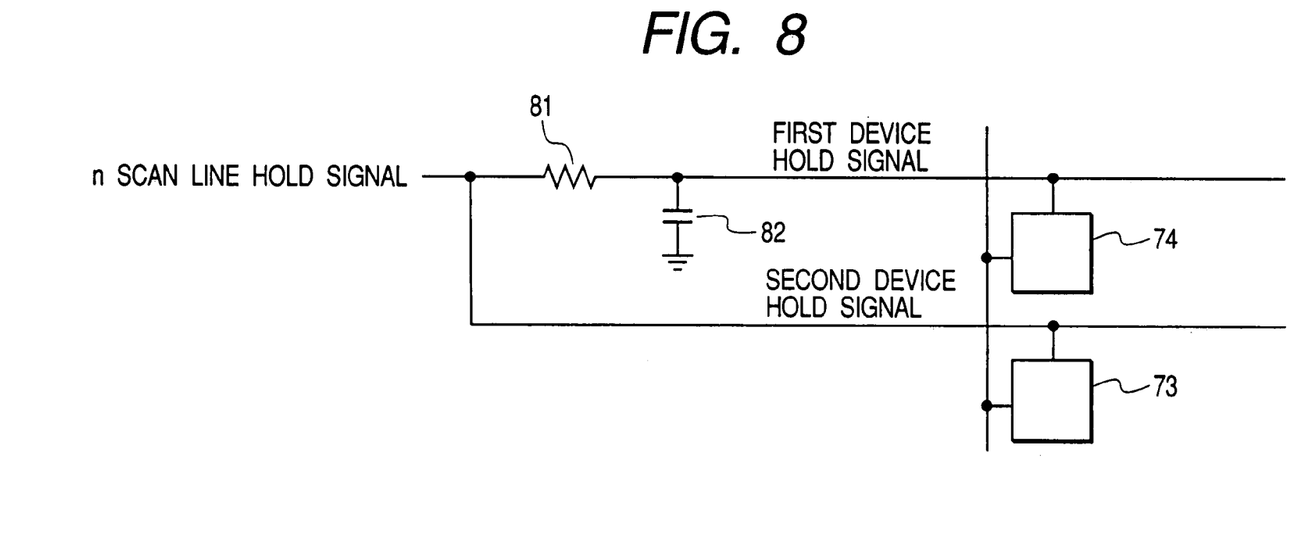
FIG. 8 is a schematic circuit diagram of another means for generating a video signal hold signal for a phosphorescent pixel and a fluorescent pixel.

FIG. 8 is a schematic circuit diagram of a circuit that can be used for producing the time difference. Note that n scan line hold signal is supplied from the V shift register 2 in FIG. 1. In FIG. 8, pixel 73 is a phosphorescent pixel and pixel 74 is a fluorescent pixel. Video signal hold signals of two different types including a first device hold signal and a second device hold signal are applied to the pixels arranged on each line. The falling edge of the first device hold signal is delayed by Td1 as shown in FIG. 17 by defining a time constant by means of a resistor 81 and a capacitance 82 (the duration of Td1 can be determined by means of the resistance of the resistor 81 and the capacity of the capacitance 82). The rising edge of the first device hold signal and that of the second device hold signal are made to agree with each other as shown in FIG. 17 in synchronism with the generation of a horizontal blank (not shown).

Now, the part of the circuit adapted to correct the difference of the initial efficiencies of electroluminescence of the two different pixels will be described below.

As pointed out above, the initial efficiency of electroluminescence of the fluorescent pixels 31, 33 and that of the phosphorescent pixel 32 remarkably differ from each other because of the difference of internal energy transition.

Figure 14:
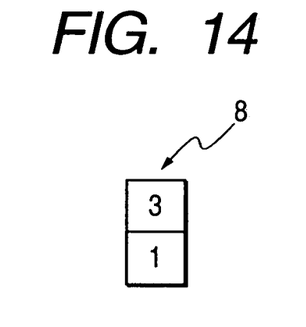
FIG. 14 is a schematic illustration of still another video signal conversion memory.

In order to equalize the ratio of electroluminescence to that of visually sensed intensity of the pixels of the two different types, the voltage of video signal is modified by using different magnifications that are determined respectively for the phosphorescent pixel 32 and the fluorescent pixels 31, 33 before it is applied to the horizontal video signal latch 4. FIG. 14 is a schematic illustration of a video signal conversion memory that can be used for this purpose. Note that the pixel matrix of the display panel 1 has 12×8 pixels (not shown). Theoretically, the efficiency of electroluminescence of a phosphorescent material is three times greater than that of a fluorescent material. Therefore, in FIG. 14, the ratio of the efficiency of electroluminescence of a phosphorescent pixel 32 to that of a fluorescent pixel 31 or 33 is made equal to 1:3, although the present invention is by no means limited thereto.

The magnifications to be used for the video signal are read with the video signal and the video signal is multiplied by the predetermined magnifications before it is fed to the horizontal video signal latch 4. The video signal latched to the horizontal video signal latch 4 is then supplied from the TFT 93 in the pixel to the organic EL device 94 as electric current at the timing given by the V shift register 2 in a manner as described earlier. For example, a video signal multiplied by a magnification of 3 as shown in FIG. 14 is supplied to the scan line 33 formed by singlet electroluminescent devices in FIG. 15, whereas a video signal multiplied by a magnification of 1 as shown in FIG. 14 is supplied to the next scan line 32 formed by triplet electroluminescent devices. As a result, the initially displayed image of the display apparatus comprising fluorescent pixels and phosphorescent pixels whose efficiencies of electroluminescence are different from each other is made to be uniform in terms of luminance to the visual sense. Note that the luminance of a phosphorescent pixel and that of a fluorescent pixel can be made to be substantially equal to each other to the visual sense by modifying the ratio of their areas.

It is known that the luminance of an organic EL device relative to the electric current falls with time. As pointed out earlier, a phosphorescent pixel 32 and a fluorescent pixel 33 are different from each other in terms of the fall of luminance with time. For the initial stages, the ratio of the efficiency of electroluminescence of the phosphorescent pixel 32 to that of the fluorescent pixel 33 is defined to be equal to 1:3 as shown in FIG. 14. However, after 1,000 hours, the ratio of the efficiency of electroluminescence of the phosphorescent pixel 32 to that of the fluorescent pixel 33 is defined to be equal to 1:2. The video signal conversion memory 8 is rewritten when the controller 7 counts 1,000 hours by using the initially specified factor for changing the ratio. The ratio of magnifications of 1:2 represents the fact that the phosphorescent pixel 32 is degraded more quickly than the fluorescent pixel 33. The magnifications that are rewritten to 1:2 are read out with the video signal for each scan line and the video signal is multiplied by a predetermined magnification and supplied to the horizontal video signal latch 4. The video signal latched to the horizontal video signal latch 4 is then supplied from the TFT 93 in the pixel to the organic EL device 94 as electric current at the timing of the V shift register 2 in a manner as described earlier. As a result, the displayed image of the display apparatus comprising fluorescent pixels and phosphorescent pixels whose service lives are different from each other is made to be uniform in terms of luminance to the visual sense regardless of the duration of the use of the display apparatus.

(Third Embodiment)

Figure 2:
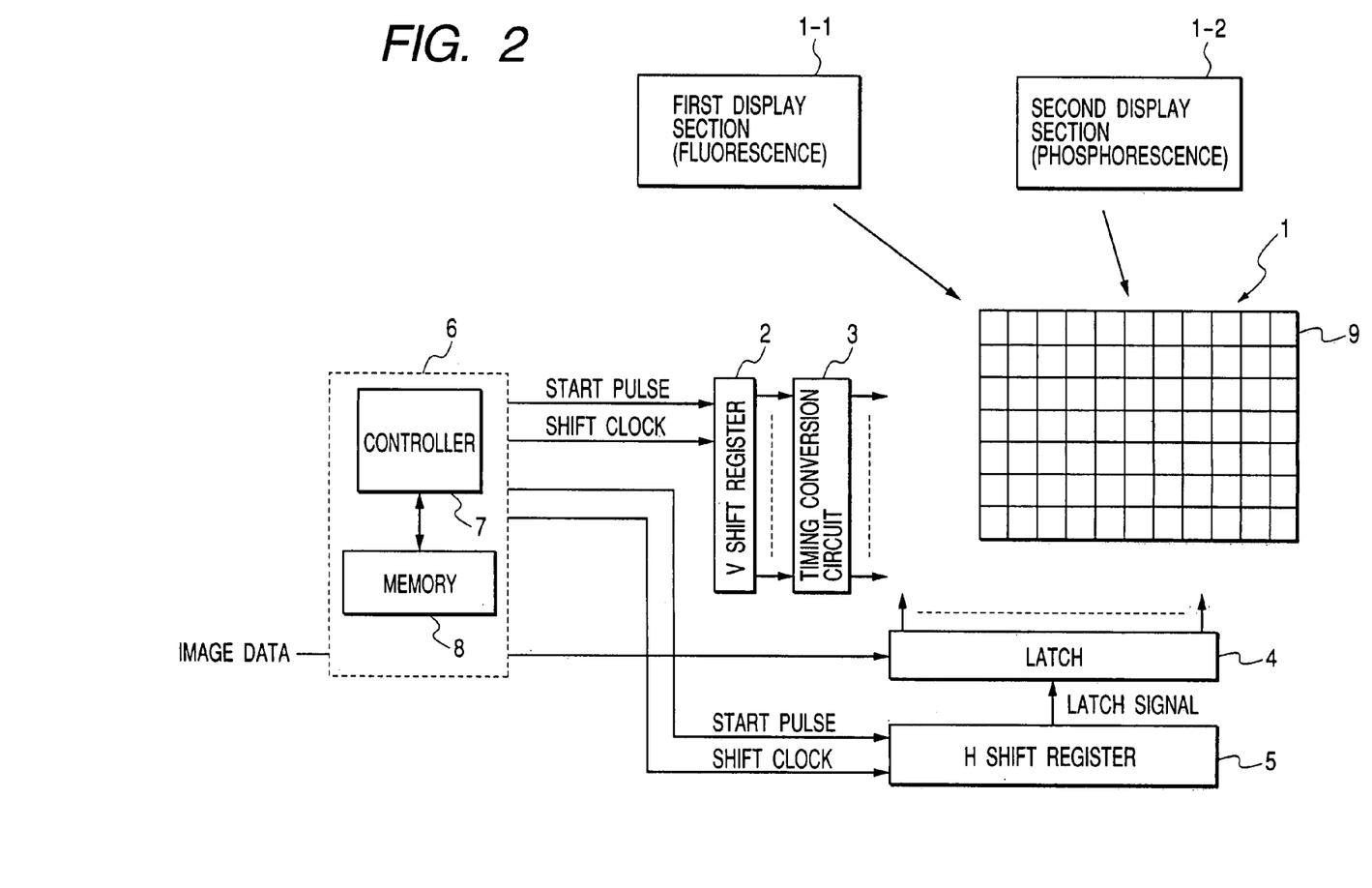
FIG. 2 is a schematic block diagram of another embodiment of display apparatus according to the invention.

As shown in FIG. 2, the display panel 1 of this embodiment comprises a first display section 1—1 that is formed by arranging only a plurality of fluorescent pixels on a substrate on a second display section 1–2 that is formed by arranging only a plurality of phosphorescent pixels on another substrate. The first display section is laid on the second display section or vice versa. More specifically, a singlet material adapted to fluorescence is laid by evaporation on a substrate on which a number of TFTs as shown in FIG. 9 are arranged, whereas a triplet material adapted to phosphorescence is laid by evaporation on another substrate on which a number of TFTs as shown in FIG. 9 are arranged.

The light decreasing time of the first display section differs from that of the second display section to give rise to a difference of light decreasing time Td1 as shown in FIG. 16.

In order to correct the difference, the falling edge of the video signal applied to the first display section 1—1 for fluorescence for the operation of signal switching to horizontal blank HBLK is delayed by a time period of Td1 from the falling edge of the video signal applied to the second display section 1–2 for phosphorescence.

Either the timing of a first device hold signal or that of a second device hold signal is given as video signal hold signal to the display section that is to be operated. A circuit for generating a time difference as shown in FIG. 7 is used to generate hold signals. A scan line hold signal is supplied from the V shift register 2 shown in FIG. 1. A second device hold signal whose falling edge is not delayed is used when the second display section 1–2 is operated. On the other hand, a first device hold signal whose falling edge is delayed by Td1 is used when the first display section 1—1 is operated. The falling edge of the first device hold signal is delayed by Td1 by means of a shift register comprising flip-flops 71, 72 (the duration of Td1 is determined by the number of steps of the flip-flops and the period of the H shift clock). The rising edge of the first device hold signal and that of the second device hold signal are made to agree with each other as shown in FIG. 17 in synchronism with the generation of a horizontal blank (not shown).

As shown in FIG. 8, the delay time can alternatively be determined by defining a time constant by means of a resistor 81 and a capacitance 82.

Now, the part of the circuit adapted to correct the difference of the initial efficiencies of electroluminescence of the two different pixels will be described below.

As pointed out above, the initial efficiency of electroluminescence of the first display section 1—1 for fluorescence and that of the second display section 1–2 for phosphorescence remarkably differ from each other because of the difference of internal energy transition.

In order to equalize the ratio of electroluminescence of the two display sections to that of visually sensed intensity of the pixels of the display sections, the voltage of video signal is modified by using different magnifications that are determined respectively for the fluorescent pixels of the first display section 1—1 and the phosphorescent pixels of the second display section 1–2 before it is applied to the horizontal video signal latch 4. FIG. 14 is a schematic illustration of some of the data stored in the video signal conversion memory that is used in this embodiment to deal with this problem. Theoretically, the efficiency of electroluminescence of a phosphorescent material is three times greater than that of a fluorescent material. Therefore, the ratio of the magnification to be used for the first display section 1—1 for fluorescence to that of the magnification to used for the second display section 1–2 for phosphorescence is made equal to 3:1. However, the ratio of magnifications can change as a function of the state of transition of internal energy of the phosphorescent material, the light decreasing efficiency that can vary depending on the concentration of the dopant and so on.

The magnifications to be used for the video signal are read with the video signal and the video signal is multiplied by the predetermined magnifications before it is fed to the horizontal video signal latch 4. The video signal latched to the horizontal video signal latch 4 is then supplied from the TFT 93 in the pixel to the organic EL device 94 as electric current at the timing given by the V shift register 2 in a manner as described earlier. For example, a video signal multiplied by a magnification of 3 as shown in FIG. 14 is supplied to the scan line 33 formed by singlet electroluminescent devices shown in FIG. 15, whereas a video signal multiplied by a magnification of 1 as shown in FIG. 14 is supplied to the next scan line 32 formed by triplet electroluminescent devices. As a result, the initially displayed image of the display section comprising fluorescent pixels and phosphorescent pixels whose efficiencies of electroluminescence are different from each other is made to be uniform in terms of luminance to the visual sense.

It is known that the luminance of an organic EL device relative to the electric current falls with time. As pointed out earlier, a phosphorescent pixel 32 and a fluorescent pixel 33 are different from each other in terms of the fall of luminance with time. For the initial stages, the ratio of the magnification applicable to the efficiency of electroluminescence of a phosphorescent pixel 32 to that applicable to the efficiency of electroluminescence of a fluorescent pixel 33 is specified to be equal to 1:3 as shown in FIG. 14. However, after 1,000 hours, the ratio of the efficiency of electroluminescence of the phosphorescent pixel 32 to that of the fluorescent pixel 33 is defined to be equal to 1:2. The video signal conversion memory 8 is rewritten when the controller 7 counts 1,000 hours by using the initially specified factor for changing the ratio. The ratio of magnifications of 1:2 represents the fact that the phosphorescent pixel 32 is degraded more quickly than the fluorescent pixel 33. The magnifications that are rewritten to 1:2 are read out with the video signal for each scan line and the video signal is multiplied by a predetermined magnification to be used for the video signal as shown in FIG. 14 and supplied to the horizontal video signal latch 4. The video signal latched to the horizontal video signal latch 4 is then supplied from the TFT 93 in the pixel to the organic EL device 94 as electric current at the timing of the V shift register 2 in a manner as described earlier. As a result the displayed image of the display apparatus comprising a first display section 1—1 and a second display section 1–2 whose service lives are different from each other is made to be uniform in terms of luminance to the visual sense regardless of the duration of the use of the display apparatus.

As described above, the present invention provides a display panel comprising phosphorescent devices formed by using a highly efficient triplet material and fluorescent devices formed by using a singlet material that can be selected from a number of currently available materials and a display panel comprising a first display section formed by using only phosphorescent devices and a second display section formed by using only fluorescent devices, the first display section and the second display section being arranged on a same display substrate (glass substrate, TFT substrate). A display panel according to the present invention can display high luminance high quality full-color images.

According to the invention, there is also provided a display apparatus comprising such a display panel and a control means having in combination a function of shifting the timing of the falling edge of a signal and a function of correcting the difference of efficiency of electroluminescence and the difference of service life for electroluminescence on the basis of the data stored in a memory means. Such a display apparatus can reduce any after glow, uneven displays in the initial stages of operation and changes with time of the displayed image so as to display images with good gradations. The video signal conversion memory and the controller may be arranged on the substrate that carries the display panel or on some other places without changing their effects.

What is claimed is:

1. A controller for a display panel comprising a plurality of pixels each having a respective organic electroluminescent device, the plurality of pixels including fluorescent pixels and phosphorescent pixels, the controller comprising:
    control circuitry supplying respective operating signals to be applied to the plurality of pixels;
    signal level adjusting circuitry receiving respective operating signals and corresponding signal level adjusting data from the control circuitry, and using the corresponding signal level adjusting data to adjust the signal levels of the respective operating signals before being applied by the signal level adjusting circuitry to the fluorescent pixels and to the phosphorescent pixels, the signal levels of the respective operating signals applied by the signal level adjusting circuitry being in accordance with the respective electroluminescence efficiencies of the fluorescent pixels and of the phosphorescent pixels; and
    signal timing circuitry extending the duration of respective operating signals supplied by the control circuitry to be applied to the fluorescent pixels relative to the duration of the respective operating signals applied to the phosphorescent pixels.

2. A controller for a display panel according to claim 1, further comprising
    a respective pixel drive circuit associated with each one of the plurality of pixels, the pixel drive circuit comprising a plurality of thin-film transistors formed on the same substrate as the organic electroluminescent device of the associated pixel, each pixel drive circuit receiving respective signal-level-adjusted and signal-duration-adjusted operating signals from the signal level adjusting circuitry and the signal timing adjusting circuitry for driving the respective organic electroluminescent device of the associated pixel, each pixel drive circuit having a p-channel thin-film transistor having a source/drain electrode coupled to a power source and another source/drain electrode coupled to an electrode of the respective organic electroluminescent device of the associated pixel.

3. A controller for a display panel according to claim 2, wherein the plurality of pixels for a plurality of pixel groups and respective pixel drive circuits associated with all fluorescent pixels of the plurality of pixel groups each have a first electrode coupled to a fluorescent pixel selection line corresponding to a scan line for selecting the plurality of pixel groups, and respective pixel drive circuits associated with all phosphorescent pixels of the plurality of pixel groups each have a first electrode coupled to a phosphorescent pixel selection line corresponding to the scan line of the plurality of pixel groups, and wherein the control circuitry provides respective first operating signals to the signal timing circuitry to be applied to the fluorescent pixel selection line and the phosphorescent pixel selection line corresponding to the scan line of the plurality of pixel groups after adjusting the relative durations of the respective first operating signals, so that the duration of the respective first operating signal applied to the fluorescent pixel selection line corresponding to the scan line is different from the duration of the respective first operating signal applied to the phosphorescent pixel selection line corresponding to the scan line of the plurality of pixel groups.

4. A controller for a display panel comprising a plurality of pixel groups arranged in an array having a plurality of rows of pixel groups and a plurality of columns of pixel groups, each one of the plurality of pixel groups in the array having a plurality of pixels each including a respective organic electroluminescent device of one of a fluorescent organic electroluminescent device and a phosphorescent organic electroluminescent device, each one of the plurality of rows of pixel groups of the array having a corresponding fluorescent pixel selection signal line and a corresponding phosphorescent pixel selection signal line, the controller comprising:
    a vertical scan circuit for sequentially selecting successive, spatially-adjacent ones of the plurality of rows of pixel groups of the array by applying respective row selection signals to the fluorescent pixel selection signal line and to the phosphorescent pixel selection signal line associated with each one of the plurality of rows of pixel groups, one row at a time, in sequential order of successive, spatially-adjacent ones of the plurality of rows of pixel groups of the array to cause one of the plurality of rows of pixel groups to which the respective row selection signals are applied to be selected at any given time, the row selection signal applied to the fluorescent pixel row selection signal line corresponding to a selected row having a trailing pulse edge transition delayed with respect to that of the row selection signal applied to the phosphorescent pixel row selection signal line corresponding to the selected row;
    a horizontal video signal circuit for applying respective video signals to the fluorescent pixel column signal line and to the phosphorescent pixel column signal line corresponding to each one of the plurality of columns of pixel groups of the array each time a respective one of the plurality of rows of pixel groups is selected by the vertical scan circuit, the respective video signals being applied for at least part of the duration of selection of the respective one of the plurality of rows, the horizontal video signal circuit having a video signal level adjusting circuit for adjusting the signal levels of respective video signals applied to the fluorescent pixel column signal line and the phosphorescent pixel column signal line corresponding to each one of the plurality of columns of pixel groups in the array in accordance with respective electroluminescence efficiencies of the fluorescent organic electroluminescent devices and the phosphorescent electroluminescent devices of respective pixels of the pixel groups of the array;

a respective drive circuit associated with each pixel of each pixel group in the array, each device circuit comprising thin-film transistors formed on the same substrate as the respective organic electroluminescent device of the associated pixel, each drive circuit associated with each pixel having a fluorescent organic electroluminescent device including a first terminal coupled to the fluorescent pixel row selection signal line corresponding to the row in which the pixel group having the associated pixel is included, and a second terminal coupled to the fluorescent pixel column signal line corresponding to the column in which the pixel group having the associated pixel is included, each drive circuit associated with each pixel including a phosphorescent electroluminescent device having its first terminal coupled to the phosphorescent pixel row selection signal line corresponding to the row in which the pixel group having the associated pixel is included, and its second terminal coupled to the phosphorescent pixel column signal line corresponding to the column in which the pixel group having the associated pixel is included, the drive circuit associated with each pixel of each pixel group responding to a respective row selection signal on a respective one of the fluorescent pixel row selection signal lines and the phosphorescent pixel row selection signal lines to which its first terminal is coupled for enabling the respective organic electroluminescent device of the associated pixel to be driven in accordance with a respective video signal on a respective one of the fluorescent pixel column signal lines and the phosphorescent pixel column signal lines to which its second terminal is coupled; and controller circuitry coupled to the vertical scan circuit to control the sequential selection of successive, spatially-adjacent ones of the plurality of rows of pixel groups of the array and to provide a row selection signal to be sequentially applied to the phosphorescent pixel row selection signal line corresponding to successive, spatially-adjacent ones of the rows of pixel groups being sequentially selected by the vertical scan circuit, and coupled to the horizontal video signal circuit for providing respective video signals to be applied to one of the fluorescent pixel column signal line and the phosphorescent pixel column signal line corresponding to respective ones of the plurality of columns of pixel groups of the array each time that a respective one of the plurality of rows of pixel groups of the array is individually selected by the vertical scan circuit and for providing corresponding signal-level adjustment data to the signal level adjusting circuit to be used for adjusting the signal levels of respective video signals to be applied to the other one of the fluorescent pixel column signal line and the phosphorescent pixel column signal line corresponding to respective ones of the plurality of columns of pixel groups of the array each time that a respective one of the plurality of rows of pixel groups of the array is selected by the vertical scan circuit, so that the signal levels of respective video signals apply to the fluorescent pixel column signal line corresponding to each one of the plurality of columns of pixel groups of the array and the signal levels of respective video signals apply to the phosphorescent pixel column signal line corresponding to each one of the plurality of columns of pixel groups of the array are adjusted in accordance with the respective electroluminescence efficiencies of the fluorescent organic electroluminescent devices and the phosphorescent organic electroluminescent devices of the pixels of the plurality of pixel groups of the array, the control circuitry having a memory storing current signal level adjusting data for adjusting the signal levels of respective video signals to be applied to each pixel in each of the plurality of pixel groups of the array.

* * * * *